United States Patent
Vecchi et al.

(10) Patent No.: US 11,486,944 B2
(45) Date of Patent: Nov. 1, 2022

(54) ISOLATED HALL SENSOR STRUCTURE

(71) Applicant: TDK-Micronas GmbH, Freiburg (DE)

(72) Inventors: Maria-Cristina Vecchi, Freiburg (DE); Reinhard Erwe, Freiburg (DE); Martin Cornils, Freiburg (DE); Kerwin Khu, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 146 days.

(21) Appl. No.: 16/897,851

(22) Filed: Jun. 10, 2020

(65) Prior Publication Data

US 2020/0393523 A1  Dec. 17, 2020

(30) Foreign Application Priority Data

Jun. 11, 2019 (DE) ..................... 10 2019 004 060.0

(51) Int. Cl.
*G01R 33/07* (2006.01)
*H01L 43/04* (2006.01)
*H01L 43/06* (2006.01)
*G01R 33/06* (2006.01)

(52) U.S. Cl.
CPC ........... *G01R 33/07* (2013.01); *G01R 33/066* (2013.01); *H01L 43/04* (2013.01); *H01L 43/065* (2013.01)

(58) Field of Classification Search
CPC ............. H01L 43/065; H01L 21/76224; H01L 21/76229; H01L 21/76264; H01L 43/04; G01R 33/07

See application file for complete search history.

(56) References Cited

U.S. PATENT DOCUMENTS

| | | | |
|---|---|---|---|
| 5,548,151 A | 8/1996 | Funaki et al. | |
| 7,772,673 B1* | 8/2010 | Yin ....................... | H01L 29/732 257/E27.001 |
| 9,097,753 B2 | 8/2015 | Raz et al. | |
| 2006/0097715 A1* | 5/2006 | Oohira .................... | H01L 27/22 324/207.2 |
| 2007/0290682 A1 | 12/2007 | Oohira et al. | |
| 2015/0270337 A1* | 9/2015 | Ujihara ............. | H01L 21/76229 257/510 |
| 2017/0236996 A1* | 8/2017 | Ausserlechner ...... | H01L 43/065 257/421 |
| 2019/0086484 A1* | 3/2019 | Green .................... | G01D 5/145 |

FOREIGN PATENT DOCUMENTS

| DE | 10 2011 107 767 A1 | 1/2013 | |
|---|---|---|---|
| JP | 2016100598 A * | 5/2016 | ............. H01L 43/04 |

* cited by examiner

*Primary Examiner* — Latanya N Crawford Eason
(74) *Attorney, Agent, or Firm* — Muncy, Geissler, Olds & Lowe, P.C.

(57) ABSTRACT

An isolating Hall sensor structure having a support structure made of a substrate layer and an oxide layer, a semiconductor region of a first conductivity type which is integrally connected to a top side of the oxide layer, at least one trench extending from the top side of the semiconductor region to the oxide layer of the support structure, at least three first semiconductor contact regions of the first conductivity type, each extending from a top side of the semiconductor region into the semiconductor region. The at least one trench surrounds a box region of the semiconductor region. The first semiconductor contact regions are each arranged in the box region of the semiconductor region and are each spaced apart from one another. A metallic connection contact layer is arranged on each first semiconductor contact region.

20 Claims, 2 Drawing Sheets

ISOLATED HALL SENSOR STRUCTURE

This nonprovisional application claims priority under 35 U.S.C. § 119(a) to German Patent Application No. 10 2019 004 060.0, which was filed in Germany on Jun. 11, 2019, and which is herein incorporated by reference.

BACKGROUND OF THE INVENTION

Field of the Invention

The present invention relates to an isolated Hall sensor structure.

Description of the Background Art

A Hall sensor structure comprising a plurality of Hall sensor elements, connected in series, is known from DE 10 2011 107 767 A1, which corresponds to U.S. Pat. No. 9,097,753, which is incorporated herein by reference. Each Hall sensor element comprises three n-type semiconductor contact regions in an n-well region, wherein an isolation region, e.g., from a heavily doped p+ diffusion, is disposed between each of the n-type semiconductor contact regions.

SUMMARY OF THE INVENTION

It is therefore an object of the present invention to provide a device that refines the state of the art.

Thus, in an exemplary embodiment, an isolating Hall sensor structure is provided, comprising a support structure made of a substrate layer and an oxide layer.

A semiconductor region of a first conductivity type that is integrally connected to the oxide layer can be formed on a top side of the oxide layer.

Furthermore, a trench is formed extending from the top side of the semiconductor region to the oxide layer, wherein the at least one trench encloses a box region of the semiconductor region.

Further, at least three first semiconductor contact regions of the first conductivity type can be formed, each extending from a top side of the semiconductor region into the semiconductor region.

The first semiconductor contact regions can each be arranged spaced apart from one another in the box region of the semiconductor region.

A metallic connection contact layer can be arranged on each first semiconductor contact region.

In addition, the isolating Hall sensor structure can have at least one second semiconductor contact region of a second conductivity type that extends in the box region from the top side of the semiconductor region into the semiconductor region, wherein each second semiconductor contact region extends at least partially along the trench.

The second semiconductor contact regions can be spaced apart from the first semiconductor contact regions, and a metallic connection contact layer is arranged on each second semiconductor contact region.

The support structure with the semiconductor region can form a so-called SOI structure. Here, the substrate layer and the semiconductor region can each be formed from silicon and the oxide layer as a silicon dioxide layer. It is understood further that the semiconductor region is divided into individual subregions by means of peripheral trenches. Because the trenches extend from the surface of the semiconductor region to the oxide layer, the individual subregions are electrically isolated from one another. The individual subregions can be called box regions.

It should be noted that the oxide layer can be formed over the entire surface of the silicon wafer. As a result, the oxide layer is buried and also referred to as buried oxide.

Furthermore, the box region of the semiconductor region can be surrounded by a trench, which can also be referred to as a deep trench, forms the active region of the structural element. In other words, the trench isolates the active region, therefore the box region, from the remaining semiconductor region, e.g., an adjacent active region.

The trenches, with the exception of the side walls, can be filled with doped polysilicon. The doped polysilicon of the trenches is preferably connected to a reference potential, preferably to a ground potential. This suppresses crosstalk between the box regions, particularly when the electrical potential between the boxes changes rapidly.

An advantage is that minority charge carriers are provided in the box region by means of the at least one second semiconductor contact region. The second connection contact layer of each second semiconductor contact region is preferably clamped to a reference potential, e.g., ground.

Investigations have shown that a temporary depletion is eliminated when the sensor is switched on, in particular with a low Hall sensor operating current, i.e., with currents in the range of 10 µA to 100 mA.

In this way, the transient properties can be improved and in particular a drift of the measured values can be suppressed immediately after switching on.

The switch-on behavior is in particular improved also at low doping of the box region in the range below $8 \cdot 10^{15}$ $N/cm^3$.

It should be noted that the sensitivity of the Hall sensor structure can be at least partially increased with a lower doping of the box region.

Another advantage is that a threshold voltage implantation can be completely avoided in the entire box region. As a result, the sensitivity of the Hall sensor structure can be increased further by suppressing surface effects.

The second semiconductor contact region can have a layer thickness of 0.1 µm-4 µm. The width of the second semiconductor contact region on the top side preferably has a range between 1 µm and 20 µm or a range between 2 µm and 10 µm or a range between 3 µm and 5 µm.

The doping concentration of the second semiconductor contact region can be above $5 \cdot 10^{17}$ $N/cm^3$ or in a range between $1 \cdot 10^{17}$ $N/cm^3$ and $1 \cdot 10^{20}$ $N/cm^3$.

The Hall sensor structure can have exactly one second semiconductor contact region, wherein the second semiconductor contact region has a closed frame-shaped form extending along a perimeter of the box region of the semiconductor region.

All second semiconductor contact regions, contained in the Hall sensor structure, together can extend along at least 50% or at least 75% or at least 95% of a perimeter of the box region of the semiconductor region.

For example, the Hall sensor structure comprises two second semiconductor contact regions, which, for example, extend along opposite edges of the perimeter of the box region, so that the first semiconductor contact regions are located between the two second semiconductor contact regions.

The box region of the semiconductor contact region can have a rectangular top side, wherein the at least one second semiconductor contact region extends along a first edge and/or along a second edge and/or along a third edge and/or along a fourth edge of the rectangular top side.

The second semiconductor contact region can have a rectangular form with a long side parallel to the edge of the box region. If the second semiconductor contact region is formed peripherally along the edge of the box region, it forms a frame.

Also, each second semiconductor contact region can adjoin the trench or has a distance of at most 10 nm or at most 100 nm from the trench.

The trench can be filled with a polysilicon. According to one embodiment, trench side walls formed by the semiconductor region are coated with a second dielectric isolation layer, wherein the second dielectric isolation layer, e.g., an oxide, has a thickness between 3 nm and 30 nm.

The first conductivity type is n-type and the second conductivity type is p-type or the first conductivity type is p-type and the second conductivity type is n-type.

It is understood that due to the higher mobility of the charge carriers, the semiconductor region in the box region preferably has an n-doping. In this case, the n constitutes the majorities within the box region. Accordingly, the positive charge carriers form the majorities within the second semiconductor contact region.

The first semiconductor contact regions can each have a dopant concentration of $5 \cdot 10^{18}$ N/cm$^3$.

The semiconductor region can have a dopant concentration of $5 \cdot 10^{14}$-$5 \cdot 10^{17}$ N/cm$^3$.

At least regions of the semiconductor region that extend between the first semiconductor contact regions or the entire semiconductor region within the box region are free of threshold voltage implantation. Threshold voltage implantation-free means that no implantation is made for setting a threshold voltage of MOS transistors, in particular no implantation of boron.

The first semiconductor contact regions can always be spaced apart from the peripheral trench.

The Hall sensor structure can have a third dielectric isolation layer, wherein the third isolation layer covers parts of the top side of the semiconductor region, in particular between the first semiconductor contact regions and preferably between the first semiconductor contact regions and the second semiconductor contact regions.

The dielectric isolation layer can comprise or consists of oxide. The oxide of the dielectric isolation layer can have a thickness of at least 1 nm or is in a range between 3 nm and 30 nm.

The third isolation layer can be formed as a gate oxide; i.e., the oxide below the gate poly in the MOS transistors has the same thickness and quality.

The first semiconductor contact regions and/or the at least one second semiconductor contact region can be produced by means of implantation and diffusion.

The second semiconductor contact regions can be connected to a reference potential, preferably the ground potential. Furthermore, the two outermost first semiconductor contacts in the box region are preferably connected.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
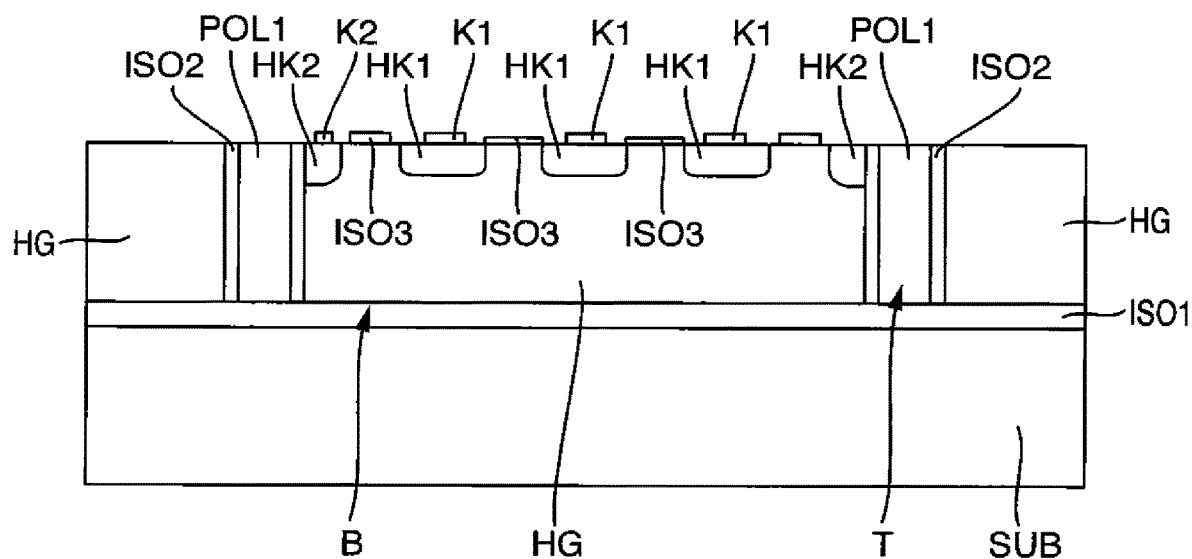
FIG. 1 shows a cross section of an exemplary embodiment of the invention of an isolating Hall sensor structure.

The illustration of FIG. 1 shows a cross section of a Hall sensor structure HAL. Hall sensor structure HAL comprises a substrate layer SUB, an oxide layer ISO1, and a semiconductor region HG of a first conductivity type formed on oxide layer ISO1. A trench T is formed in semiconductor region HG, wherein the trench separates a box region B, the active region of the structural element, from the rest of semiconductor region HG.

The trench has side faces formed by semiconductor region HG, wherein the side faces are covered by a second dielectric isolation layer. The trench is also filled with a polysilicon POL1.

Three first semiconductor contact regions HK1 of the first conductivity type are formed in box region B of semiconductor body HG, wherein each first semiconductor contact region HK1 extends from a top side of box region B in a well shape into box region B of semiconductor body HG, and an at least regionally formed first contact layer K1 is formed on each first semiconductor contact region HK1 so as to form active electrical connections.

First semiconductor contact regions HK1 are each arranged spaced apart from one another and from the trench, wherein a third dielectric isolation layer ISO3 is formed on the top side of box region B of semiconductor region HG at least between two adjacent first semiconductor contact regions HK1.

Hall sensor structure HAL also has a second semiconductor contact region HK2 of a second conductivity type, wherein the second semiconductor contact region extends from the top side of box region B in a well shape into box region B of semiconductor body HG, adjoins trench T, and extends along the entire trench T.

To establish an active electrical connection, a second connection contact layer K2 is formed on a top side of second semiconductor contact region HK2, at least in areas.

Figure 2:
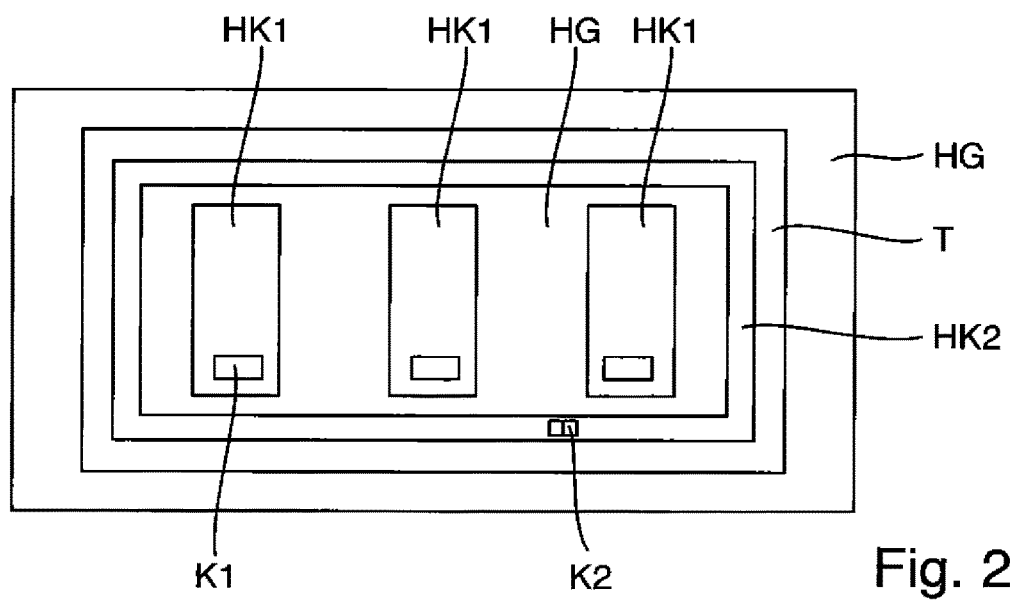
FIG. 2 shows a plan view of an exemplary embodiment of the invention of the isolating Hall sensor structure.

A plan view of an exemplary embodiment is shown in the illustration of FIG. 2. Only the differences from the illustration in FIG. 1 will be explained below.

Metallic connection contact layers K1 are formed in areas on first semiconductor contact regions HK1.

Box region B has a rectangular top side or a top side with a rectangular perimeter, wherein second semiconductor contact region HK2 extends at a distance from trench T along the entire perimeter of the top side of the box region.

Figure 3:
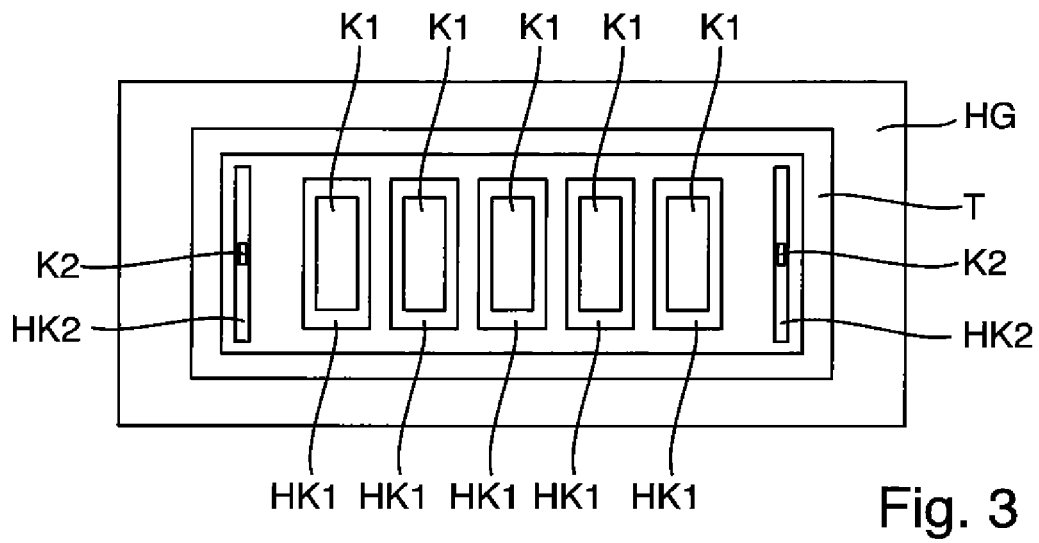
FIG. 3 shows a plan view of an exemplary embodiment of the invention of the Hall sensor structure.

A plan view of an exemplary embodiment is shown in the illustration of FIG. 3. Only the differences from the illustration in FIG. 2 will be explained below.

In the embodiment shown, Hall sensor structure HAL comprises five first semiconductor contact regions HK1, each with a first metallic connection contact layer, formed thereon in areas, and two second semiconductor contact regions HK2, wherein second semiconductor contact regions HK2 extend along two opposite sides of the rectangular top side of the box region and at a distance from trench T.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An isolating Hall sensor structure comprising:
a support structure formed of a substrate layer and an oxide layer;
a semiconductor region of a first conductivity type that is integrally connected to a top side of the oxide layer;
a plurality of trenches each extending from the top side of the semiconductor region to the oxide layer of the support structure, the plurality of trenches surrounding a box region (active region) of the semiconductor region;
a dielectric isolation layer formed on side of each of the plurality of trenches;
at least three first semiconductor contact regions of the first conductivity type, each extending from a top side of the semiconductor region into the semiconductor region, the first semiconductor contact regions being arranged in the box region of the semiconductor region and are spaced apart from one another;
a first metallic connection contact layer arranged on each the first semiconductor contact regions;
at least one second semiconductor contact region of a second conductivity type that extends in the box region from the top side of the semiconductor region into the semiconductor region, each second semiconductor contact region extending at least partially along the trench and is spaced from the first semiconductor contact regions; and
a second metallic connection contact layer arranged on each second semiconductor contact region,
wherein at least regions of the semiconductor region that extend between the first semiconductor contact regions or an entirety of the semiconductor region are free of threshold voltage implantation.

2. The Hall sensor structure according to claim 1, wherein the at least three first semiconductor contact regions have a layer thickness of 0.1 μm-4 μm.

3. The Hall sensor structure according to claim 1, wherein the Hall sensor structure has exactly one second semiconductor contact region and the second semiconductor contact region has a closed form extending along a perimeter of the box region of the semiconductor region.

4. The Hall sensor structure according to claim 1, wherein all second semiconductor contact regions contained in the Hall sensor structure extend along at least 50% or at least 75% or at least 95% of a perimeter of the box region of the semiconductor region.

5. The Hall sensor structure according to claim 1, wherein the box region of the semiconductor region has a rectangular top side, and
wherein the at least one second semiconductor contact region extends along a first edge and/or along a second edge and/or along a third edge and/or along a fourth edge of the rectangular top side.

6. The Hall sensor structure according to claim 1, wherein each second semiconductor contact region adjoins the trench or has a distance of at most 10 nm or at most 100 nm from the trench.

7. The Hall sensor structure according to claim 1, wherein each of the plurality of trenches is filled with a polysilicon.

8. The Hall sensor structure according to claim 1, wherein side walls of the plurality of trenches are formed by the semiconductor region and are coated with a second dielectric isolation layer, and
wherein the second dielectric isolation layer has a thickness between 3 nm and 30 nm.

9. The Hall sensor structure according to claim 1, wherein the first conductivity type is n-type and the second conductivity type is p-type or wherein the first conductivity type is p-type and the second conductivity type is n-type.

10. The Hall sensor structure according to claim 1, wherein the first semiconductor contact regions each have a dopant concentration of $5 \cdot 10^{18}$ N/cm$^3$.

11. The Hall sensor structure according to claim 1, wherein the semiconductor region has a dopant concentration of $5 \cdot 10^{14}$-$5 \cdot 10^{17}$ N/cm$^3$.

12. The Hall sensor structure according to claim 1, wherein the first semiconductor contact regions are each spaced apart from the trench.

13. The Hall sensor according to claim 1, wherein the at least three first semiconductor contact regions are formed on a top surface of the semiconductor region.

14. The Hall sensor according to claim 1, wherein the at least three first semiconductor contact regions each have a first metallic connection contact layer formed thereon.

15. The Hall sensor according to claim 1, further comprising a third dielectric isolation layer formed on a top surface of the semiconductor region between the at least three first semiconductor contact regions.

16. The Hall sensor according to claim 1, wherein the plurality of trenches comprises exactly two trenches.

17. The Hall sensor according to claim 1, wherein the substrate is a silicon-on-insulator (SOI) semiconductor wafer.

18. The Hall sensor according to claim 1, wherein the oxide layer forms a bottom of the plurality of trenches.

19. An isolating Hall sensor structure comprising:
a substrate layer;
an oxide layer disposed on the substrate layer;
a semiconductor region of a first conductivity type connected to a top side of the oxide layer;
a plurality of trenches each extending from the top side of the semiconductor region to the oxide layer of the support structure, the plurality of trenches surrounding an active region of the semiconductor region;
three first semiconductor contact regions of the first conductivity type, the first semiconductor contact regions being arranged in the active region of the semiconductor region and are spaced apart from one another;
a first metallic connection contact layer arranged on each the first semiconductor contact regions;
at least one second semiconductor contact region of a second conductivity type, each second semiconductor contact region extending at least partially along the trench and is spaced from the first semiconductor contact regions; and
a second metallic connection contact layer arranged on each second semiconductor contact region,
wherein at least regions of the semiconductor region that extend between the first semiconductor contact regions or an entirety of the semiconductor region are free of threshold voltage implantation.

20. An isolating Hall sensor structure comprising:
a support structure formed of a substrate layer and an oxide layer;

a semiconductor region of a first conductivity type that is integrally connected to a top side of the oxide layer;

a plurality of trenches each extending from the top side of the semiconductor region to the oxide layer of the support structure, the plurality of trenches surrounding a box region (active region) of the semiconductor region;

at least three first semiconductor contact regions of the first conductivity type, the first semiconductor contact regions being arranged in the box region of the semiconductor region and are spaced apart from one another;

a first metallic connection contact layer arranged on each the first semiconductor contact regions;

at least one second semiconductor contact region of a second conductivity type, each second semiconductor contact region extending at least partially along each of the plurality of trenches and is spaced from the first semiconductor contact regions; and a second metallic connection contact layer arranged on each second semiconductor contact region, wherein at least regions of the semiconductor region that extend between the first semiconductor contact regions or an entirety of the semiconductor region are free of threshold voltage implantation, and wherein the first semiconductor contact regions are each spaced apart from the trench.

* * * * *